United States Patent
Curry et al.

(10) Patent No.: US 6,245,998 B1
(45) Date of Patent: Jun. 12, 2001

(54) CABLE MANAGEMENT ASSEMBLY FOR EQUIPMENT RACKS

(75) Inventors: Richard Wynn Curry, Fountaintown; Timothy Charles Miller, Indianapolis; Ronald Lee Wild, Carmel, all of IN (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/427,900

(22) Filed: Oct. 27, 1999

(51) Int. Cl.$^7$ ........................................ H01B 3/00
(52) U.S. Cl. .................. 174/72 A; 248/49; 211/88.01; 312/264
(58) Field of Search ................... 174/48, 50, 68.1, 174/68.3, 72 A, 135, 95, 97, 136; 248/49; 211/88.01, 94.01; 312/264

(56) References Cited

U.S. PATENT DOCUMENTS

| | | | | |
|---|---|---|---|---|
| D. 360,189 | * | 7/1995 | Orlando | D13/154 |
| 2,140,376 | * | 12/1938 | Anderson | 175/298 |
| 5,401,193 | * | 3/1995 | Lo Cicero et al. | 439/713 |
| 5,448,015 | * | 9/1995 | Jamet et al. | 174/68.3 |
| 5,765,698 | * | 6/1998 | Bullivant | 211/26 |
| 5,867,372 | * | 2/1999 | Shie | 361/826 |
| 5,922,997 | * | 7/1999 | Lecinski | 174/135 |
| 6,011,221 | * | 1/2000 | Lecinski et al. | 174/72 A |
| 6,118,075 | * | 9/2000 | Baker et al. | 174/72 A |

OTHER PUBLICATIONS

1. Chatsworth Products, Inc., Specifications for Cable Stowage Panel, two pages (undated).
2. Panduit Network Systems Group, Advertisement—The New Standard for Cable Management, Cabling Business Magazine, Apr. 1999, at p. 11.
3. Panduit Corp., "The Next Generation in Cable Administration", Internet advertisement (one page—undated).
4. Panduit Corp., "Closet Cabling Solutions Correspondence Course" Internet advertisement (one page—undated).
5. Panduit Corp., Installation Instructions for "Open–Access" Cable Management Strain Relief Clip, Part No. CMSRC2 (undated).

* cited by examiner

Primary Examiner—Dean A. Reichard
Assistant Examiner—Adolfo Nino
(74) Attorney, Agent, or Firm—Law Office of Leo Zucker

(57) ABSTRACT

A cable management assembly for use with equipment racks wherein equipment panels are fastened along vertical mounting rails of the rack. In one embodiment, the assembly includes an elongated trough having a back wall, a bottom wall and a front wall. The back wall is constructed to be fastened to the mounting rails of the equipment rack, and the bottom wall extends a sufficient distance forward so that the trough accommodates wire or fiber optic cables terminated at one or more equipment panels fastened to the rack above the back wall of the trough. A door has its bottom edge hinged to the front wall of the trough, and the door extends at a first position to protect cables terminated at one or more equipment panels mounted on the rack above the back wall of the trough. The door can be swung to a second position to permit access to the cables and the panels at which they terminate.

19 Claims, 5 Drawing Sheets

CABLE MANAGEMENT ASSEMBLY FOR EQUIPMENT RACKS

BACKGROUND OF THE INVENTION

1. Field of the Invention

This invention relates to arrangements for dressing or managing wire and fiber optic cables in the vicinity of an equipment rack where the cables are terminated.

2. Discussion of the Known Art

Equipment racks having a pair of vertical mounting rails spaced apart typically by about 19 or more inches, are generally known. Each rail has evenly-spaced, threaded mounting holes formed along its length. Electronic and communication equipment shelves or cabinets are often provided with front panels that protrude horizontally from both sides of the equipment, and openings are provided in the protruding portions of the panels to register with corresponding mounting holes in the rails of an equipment rack. Screws inserted in the panel openings can then engage the mounting holes in the rack rails, to mount the equipment securely within the rack. Industry standard 19-inch wide equipment panels are typically sized in their height dimension in multiples of so-called "U" units, wherein one U is about 1.75 inches.

Equipment racks at communication switching facilities typically house numerous equipment cabinets or shelves, each with its own front panel on which cable connectors are arrayed. A number of copper wire or fiber optic cables terminate at the connectors on the equipment panels, so the cables must be managed or dressed to be readily identifiable and individually accessible near or at their points of termination on the equipment panels.

Fiber optic equipment boxes with an integral horizontal shelf formed at a lower, front portion of the box, are known. The box is mounted with side wall flanges to the rails of an equipment rack, with the shelf portion of the box projecting forward from the rack. Such equipment box/shelf combination units may also be known as "seven-inch" Fiber Optic Distribution Shelves.

A cable management arrangement offered by Panduit has 83-inch high, vertical panels located on sides of equipment racks having the mentioned seven-inch shelves mounted on them. The panels are claimed to have pass-through openings to facilitate patching of cables between equipment mounted at the front and at the rear of the rack.

Horizontal cable management units are also offered by Panduit, and by Chatsworth Products, Inc. These units are in the form of a rectangular duct with a long back panel arranged for mounting horizontally on an equipment rack. Sets of flexible, spaced fingers project forward of the back panel forming top and bottom walls of the duct. Cables can be guided through the duct and let out between the fingers to connect with equipment panels on the rack.

As far as is known, no horizontal cable management unit is available which in addition to ducting a group of cables, also serves to guard the cables and the panels where they terminate, even if the panels are mounted above the management unit.

SUMMARY OF THE INVENTION

According to one aspect of the invention, a cable management assembly includes an elongated trough having a back wall, a bottom wall and a front wall, wherein opposite end portions of the back wall are arranged to be fastened to mounting rails of an equipment rack. The bottom wall extends forward a sufficient distance from the back wall so that the trough will contain a number of cables terminated at one or more equipment panels fastened to the rack above the back wall of the trough. The assembly also has a door, and hinge parts associated with the trough front wall for engaging the door to permit swinging movement of the door. The door can be swung between a first position where it extends vertically to protect cables terminated at one or more equipment panels on the rack above the back wall of the trough, and a second position where the door is swung downward to permit access to the cables and the panels at which the cables terminate.

According to another aspect of the invention, a cable management assembly includes an elongated trough having a bottom wall and a front wall, and flange parts extending rearward from opposite ends of the bottom wall wherein the flange parts are arranged to be mounted to a given equipment panel that is fastened to the rails of an equipment rack. The bottom wall of the trough extends forward a sufficient distance from the flange parts so that the trough will contain a number of cables terminated on the given panel.

According to another aspect of the invention, a cable management assembly includes an elongated trough having a front wall, a bottom wall, and a back wall. Opposite end portions of the back wall are arranged to be mounted to a given equipment panel that is fastened to the rails of an equipment rack. The bottom wall of the trough extends forward a sufficient distance from the back wall so that the trough will contain a number of cables terminated at one or more equipment panels including the given panel.

In addition, according to the invention, opposite end portions of the bottom wall may be formed to define a minimum bend radius so that cables dressed along the bottom wall bend safely to hang vertically and clear of lower equipment panels that are fastened to rack.

For a better understanding of the invention, reference is made to the following description taken in conjunction with the accompanying drawing and the appended claims.

DETAILED DESCRIPTION OF THE INVENTION

Figure 1:
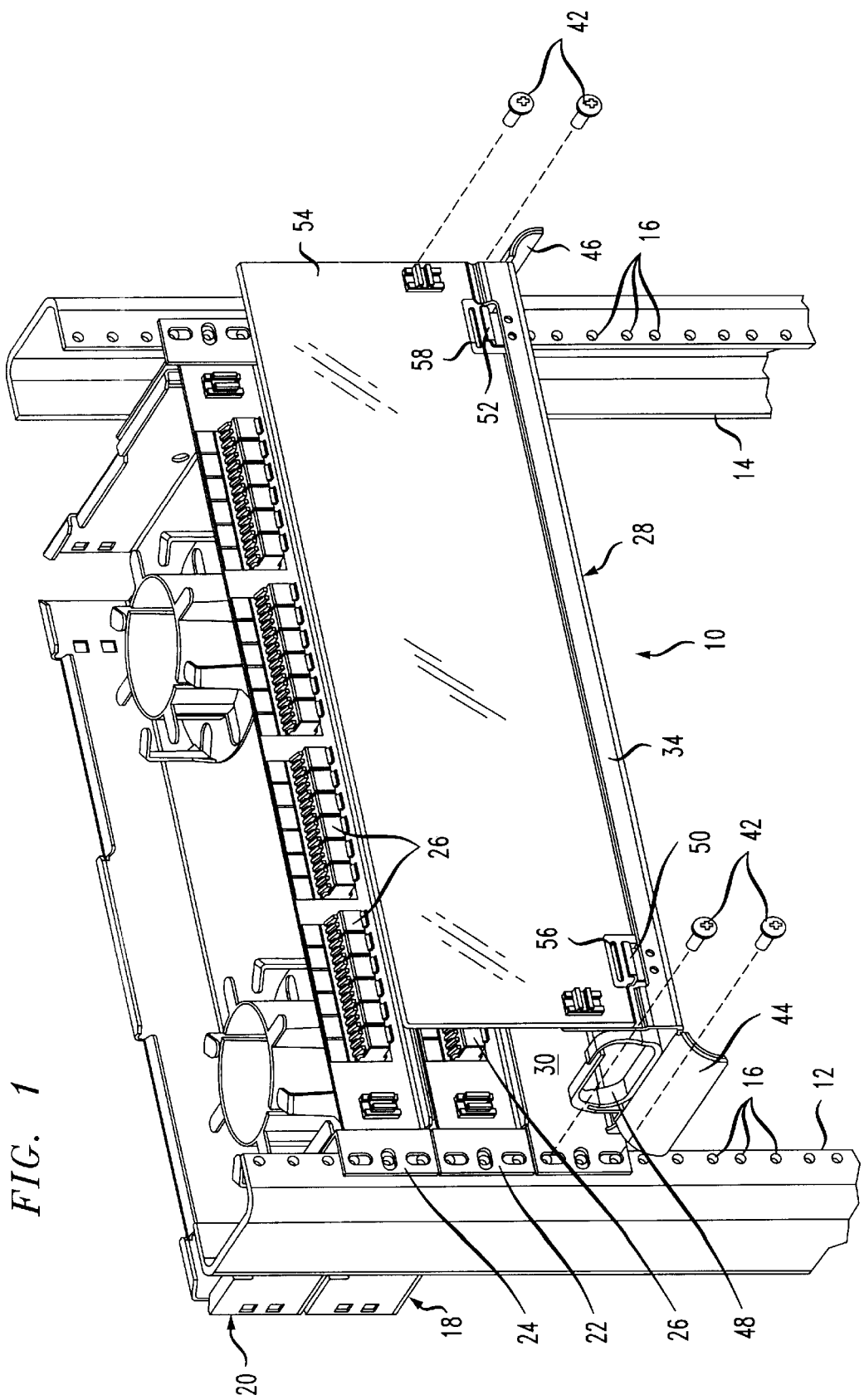
FIG. 1 is a perspective view of a first embodiment of a cable management assembly being fastened to an equipment rack.

FIG. 1 is a perspective view of a first embodiment of a cable management assembly 10 according to the invention. In FIG. 1, the assembly 10 is being fastened to a pair of mounting rails 12, 14, forming part of an equipment rack. Each of the rails, 12, 14 has equi-spaced threaded mounting holes 16 formed along the length of the rail. The mounting rails 12, 14 are spaced apart so that the horizontal distance between corresponding mounting holes 16 at the same height in the rails is, for example, about 18.32 inches for applications involving standard 19-inch equipment racks.

As shown in FIG. 1, two communication equipment shelves 18, 20 are mounted within the equipment rack with which the vertical mounting rails 12, 14 are associated. Each of the equipment shelves 18, 20 has a corresponding front panel 22, 24 with communication connector jacks 26 arrayed along the faces of the front panels 22, 24. The jacks 26 receive corresponding plug connectors (not shown) that terminate communication cables inside a communication switching facility or other installation where the equipment shelves 18, 20 are located. As mentioned, copper wire, optical fiber, or both kinds of cables may be present at such facilities.

In the illustrated embodiment, the front panels 22, 24 of the equipment shelves 18, 20 are of the standard 19-inch kind, and each has a height of one U or about 1.75 inches. A portion of the mounting rails 12, 14 just below the front panel 22 is left available for mounting of the cable management assembly 10, as explained below.

Figure 2:
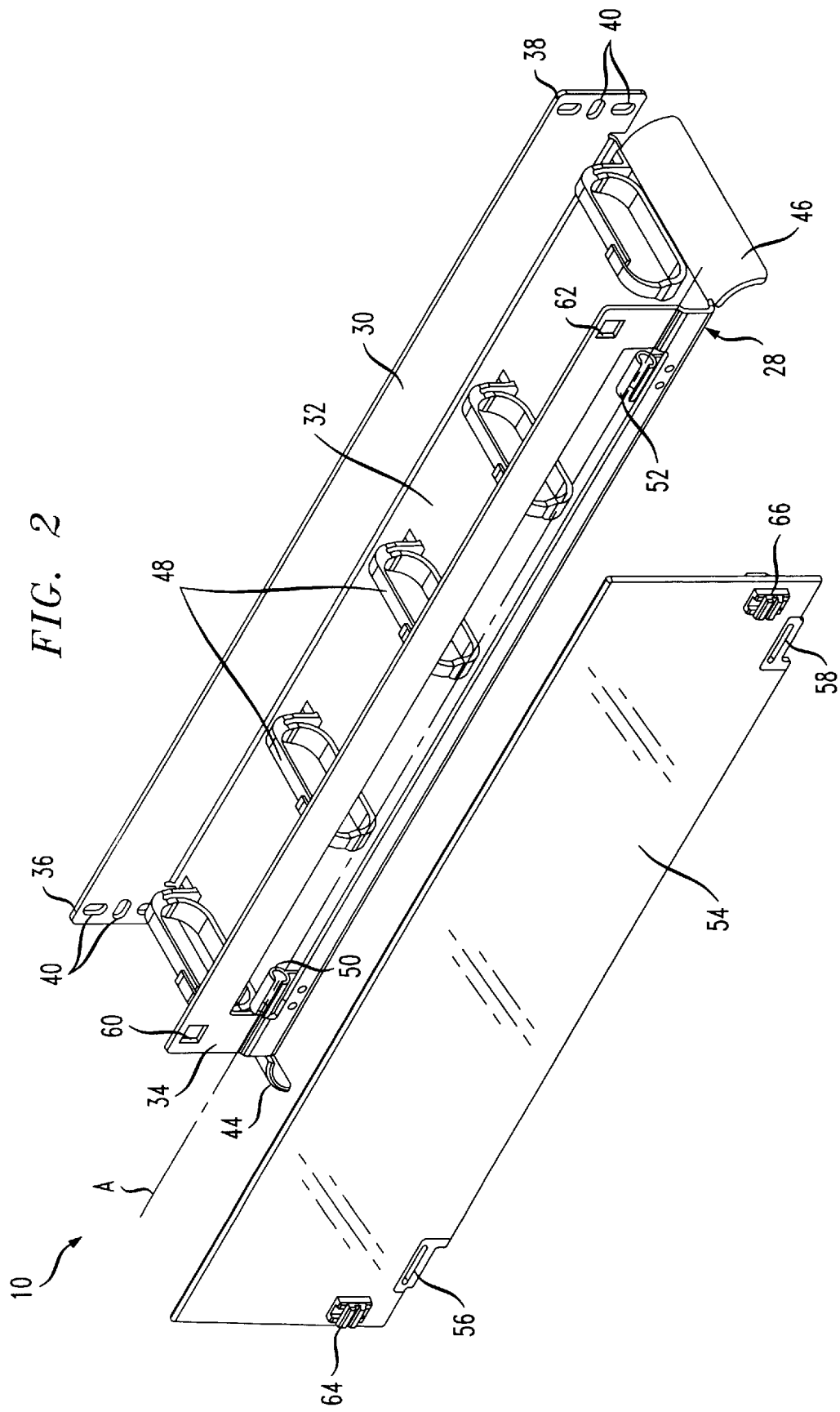
FIG. 2 is a perspective view of a trough in the assembly in FIG. 1, with a door removed to show the trough interior.

As seen in FIGS. 1 and 2, the assembly 10 comprises a trough 28 having a back wall 30, a bottom wall 32, and a front wall 34. In the illustrated environment, the back wall 30 is in the form of a typical 19-inch equipment front panel having a height of one U or about 1.75 inches. Opposite end portions 36, 38 of the back wall 30 are arranged with openings 40 so that the back wall 30 can be fastened to the mounting rails 12, 14 by way of, e.g., threaded screws 42. The walls of the trough 28 may be formed of, e.g., sheet aluminum.

The bottom wall 32 of the trough 28 extends forward from the back wall 30 by a sufficient distance, e.g., about 4 inches, so that the trough can accommodate a number of cables when connected to the jacks on the equipment panels 22, 24 mounted above the back wall 30 of the assembly 10, and the cables can be dressed along the length of the bottom wall 32 toward either side end of the trough 28. Opposite end portions 44, 46 of the bottom wall 32, are formed to define a minimum bend radius of, e.g., 0.75 inch, so that cables dressed along the bottom wall will bend safely to hang vertically and clear of lower equipment panels that may be fastened to the rails 12, 14. One or more cable retainers 48 may be fixed on the bottom wall 32 of the trough 28, for restraining cables that are dressed along the length of the trough.

Two axially slotted ferrules or hinge parts 50, 52 are fixed at opposite ends of the front wall 34, toward a bottom edge of the wall. The ferrules 50, 52 together define a hinge axis A that is parallel to the bottom edge of the wall 34, and a generally rectangular door 54 is mounted for swinging movement about the axis A with respect to the trough 28. Door 54 may be swung between a first position where the door extends vertically (see FIG. 1) to protect cables that terminate at one or more equipment panels fastened to the rails 12, 14 above the back wall 30 of the trough; and a second position where the door 54 is swung downward to permit access to the cables. The door 54 has. a pair of horizontal slots 56, 58 along a lower edge of the door, through which slots the ferrules 50, 52 engage the door 54 for swinging movement about the axis A. See FIG. 1.

A pair of apertures 60, 62 are formed in upper corners of the front wall 34. The apertures 60, 62 are dimensioned to mate with corresponding turn latches 64, 66 arranged at the sides of the door 54, so that the door can be retained in its vertical (first) position when the latches 64, 66 engage the apertures 60, 62 in the trough front wall 34. In the disclosed embodiment, the door 54 has a height greater than the height of the back wall 30 of the trough, e.g., a height of 3U, to guard cables terminating at either of the 1U equipment panels 22, 24 mounted above the back wall 30 of the assembly 10. See FIG. 1.

The door 54 may be molded from a substantially transparent or translucent material such as, e.g., flame-retardant polycarbonate. Also, if desired, the door may have a color tint (e.g., black) to provide an appearance that conforms with or complements colors of equipment panels and racks where the assembly 10 is used.

Figure 3:
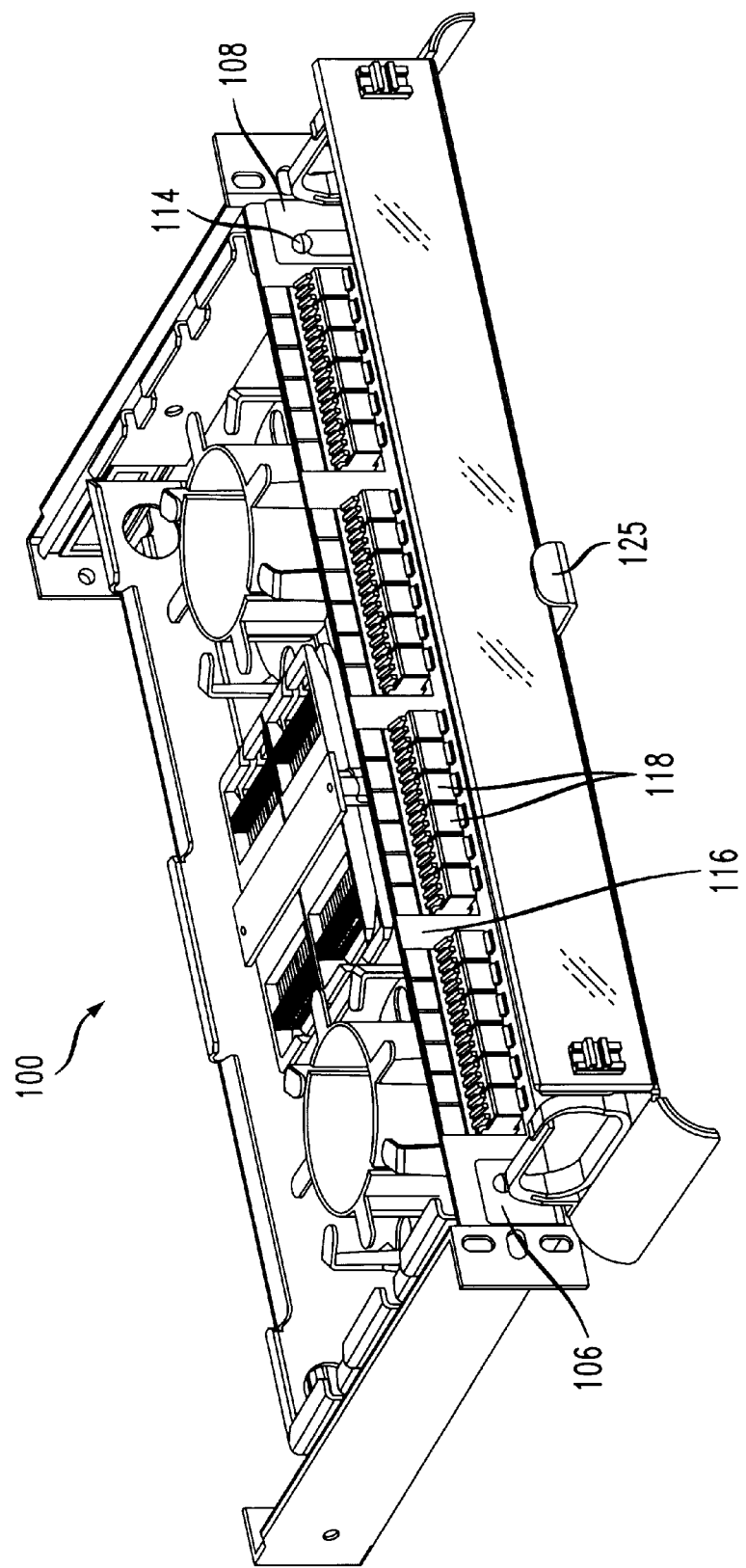
FIG. 3 is a perspective view of a second embodiment of a cable management assembly fastened on a front panel of a rack-mounted shelf.
Figure 4:
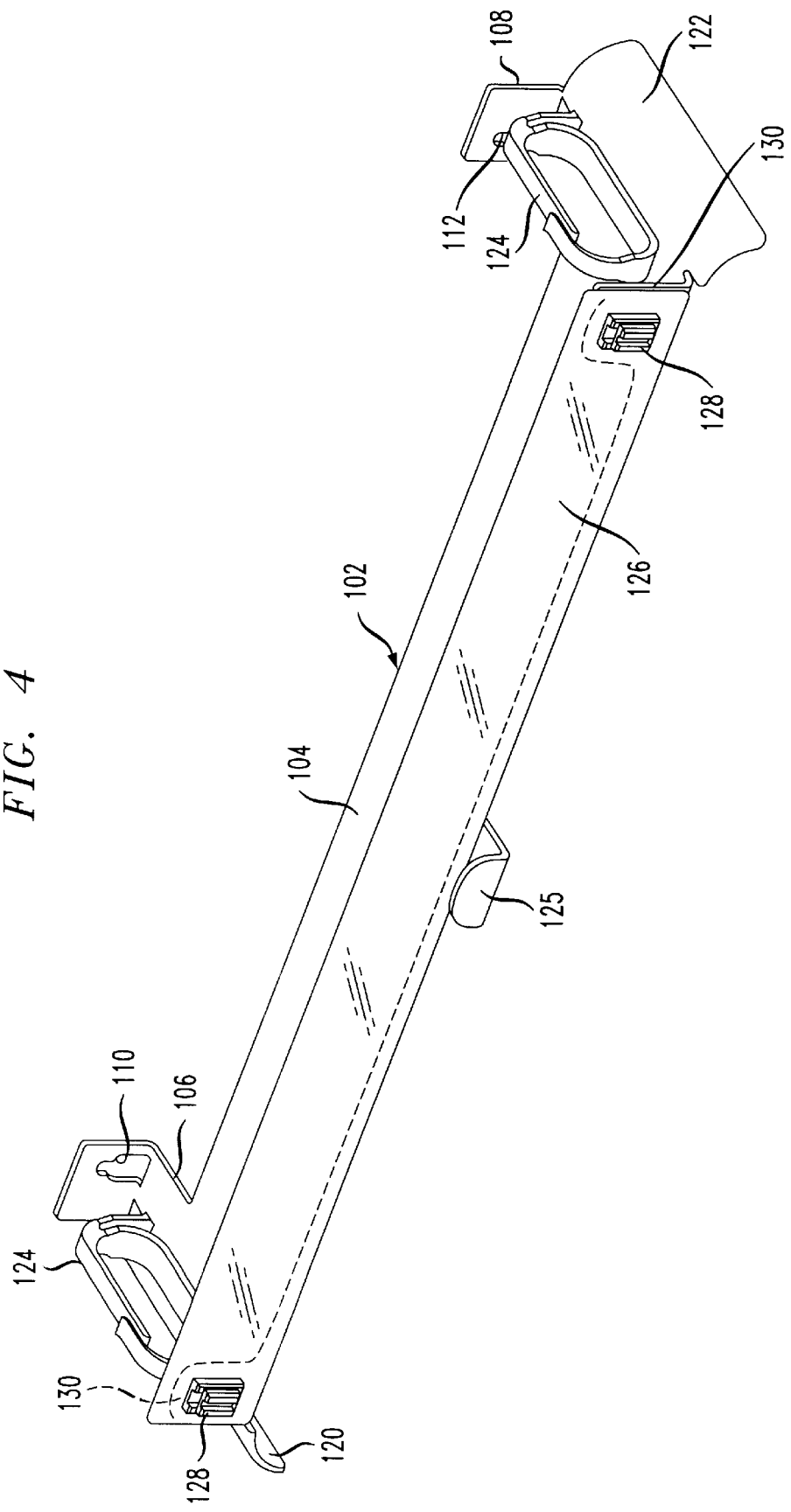
FIG. 4 is a perspective view of a trough in the assembly in FIG. 3.

FIG. 3 is a perspective view of a second embodiment of a cable management assembly 100 according to the invention, and FIG. 4 is a perspective view of a trough 102 of the assembly 100.

The trough 102 has a bottom wall 104, and flange parts 106, 108 that may be formed integrally with the bottom wall 104 and extend rearward from opposite end portions of the bottom wall. The flange parts, 106, 108 are constructed with corresponding apertures 110, 112 the tops of which are slotted for receiving the bodies of corresponding fastening screws 114, one of which screws is visible in FIG. 3. The screws 114 engage threaded openings formed at opposite ends of a given equipment panel 116 that is fastened to mounting rails (not shown in FIG. 3) of an equipment rack. The horizontal distance between centers of the apertures 110, 112 may be, e.g., about 15.480 inches for mounting on typical 19-inch equipment panels.

The bottom wall 104 of the trough 102 extends forward a sufficient distance, e.g., about 4 inches, from the flange parts 106, 108 so that the trough 102 can contain cables terminated at one or more communication jacks 118 arrayed across the equipment panel 116, and the cables can be dressed along the length of the bottom wall 104 of the trough 102.

In the illustrated embodiment, opposite end portions 120, 122 of the bottom wall 104 are formed to define a minimum bend radius of, e.g., about 0.75 inch. Thus, cables dressed along the bottom wall 104 will bend safely to hang vertically and clear of lower equipment panels that are mounted beneath the given panel 116. Also, one or more cable retainers 124 are fixed on the bottom wall 104 of the trough for restraining cables that are dressed along the bottom wall, to hang from either of the opposite end portions 120, 122. A finger pull bar 125 on the trough 102 allows the equipment panel 116 and its associated shelf to be easily withdrawn from the rack while joined to the assembly 100, when desired.

The trough 102 also has a front wall 126. In the embodiment of FIGS. 3 and 4, the wall 126 is in the form of a removable door that is secured at either end by way of conventional, finger-operated turn latches 128 which engage corresponding lugs 130 that extend upward from the bottom wall 104 of the trough. Thus, the door forming the front wall 126 may be unlatched and removed from the trough 102 to provide easier access to cables that are terminated at the equipment panel 116, provided there is no trough or shelf just above the panel 116.

The bottom wall 104 and flange parts 106, 108 of the trough 102, may be integrally formed of, e.g., sheet aluminum. The door forming the front wall 126 may be molded of a substantially transparent material such as, e.g., polycarbonate. And, if desired, the door may have a color tint (e.g., black) to conform with or complement equipment panels and racks where the assembly 100 is to be used.

In FIGS. 3 and 4, the assembly 100 is dimensioned and arranged for mounting on one equipment panel having a 1U height. The assembly 100 may be modified, however, to accommodate equipment panels of greater height, or more than one panel of 1U height. Such a modification is shown in cable management assembly 150 in FIG. 5.

Figure 5:
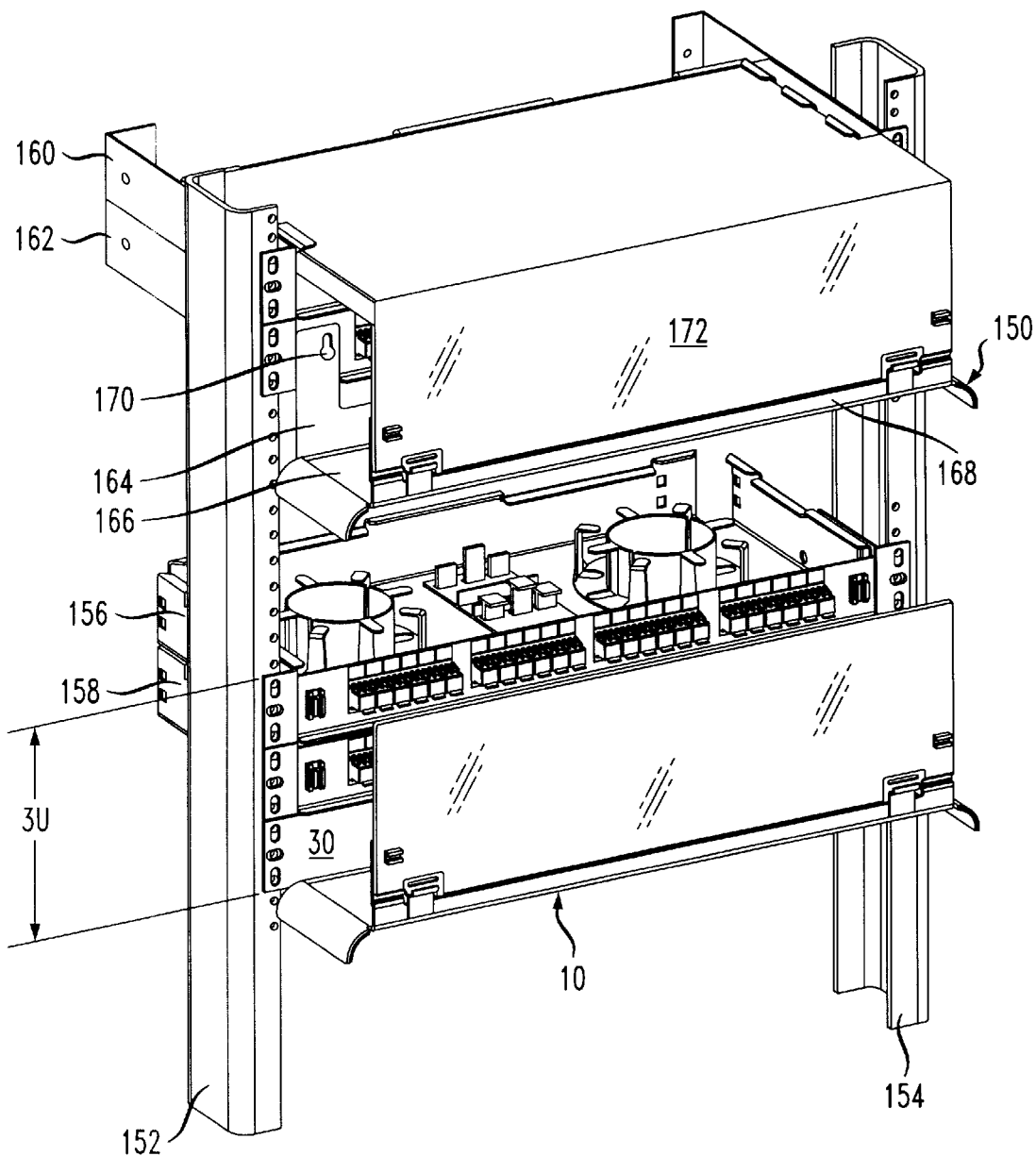
FIG. 5 is a perspective view of the first and a third embodiment of a cable management assembly, which are fastened to an equipment rack.

In FIG. 5, an equipment rack has a pair of vertical mounting rails, 152, 154. Two equipment shelves 156, 158 each having 1U front panels, are fastened to the rails one above the other at the lower portion of the figure. One of the present cable management assemblies 10 has its back wall 30 fastened to the rails 152, 154, just below the panel of shelf 158.

At the upper portion of FIG. 5, two equipment shelves 160, 162 are stacked one over the other, also with 1U front panels fastened to the rails 152, 154. The assembly 150 has a trough with a back wall 164, a bottom wall 166, and a front wall 168. The back wall 164 has apertures 170 at upper corners of the wall, and the apertures 170 are slotted to receive the bodies of corresponding screws which are threaded into openings formed in the front panel on shelf 162. Further, a separate door 172 is provided, and the door is hinged to the front wall 168 in a manner similar to the door 54 and the trough front wall 34 in the assembly 10 in FIGS. 1 and 2. The door 172 is of such height as to guard cables terminated at either panel of the equipment shelves 160, 162 when the door is in its first (vertical) position in FIG. 5.

While the foregoing description represents preferred embodiments, it will be obvious to those skilled in the art that various changes and modifications may be made, without departing from the spirit and scope of the invention pointed out by the following claims.

We claim:

1. A cable management assembly for an equipment rack wherein equipment panels are fastened along vertical mounting rails of the rack, the assembly comprising:

an elongated trough having a back wall, a bottom wall and a front wall;

wherein opposite end portions of the back wall in the long direction of the back wall are arranged to be fastened to the mounting rails of the equipment rack; and the bottom wall of the trough extends a sufficient distance from the back wall so that the trough can accommodate a number of cables when connected on one or more equipment panels fastened to the rack above the back wall of the trough, and the cables can be dressed along the length of the bottom wall; and a generally rectangular door, and hinge parts associated with the front wall of the trough for engaging the door near a bottom edge to permit swinging movement of the door with respect to the trough between a first position whereat the door extends vertically to protect cables terminated at one or more equipment panels fastened to the rack above the back wall of the trough, and a second position whereat the door is swung downward to permit access to the cables and the panels at which they terminate.

2. A cable management assembly according to claim 1, wherein opposite end portions of the bottom wall are constructed and arranged to define a minimum bend radius so that cables dressed along the bottom wall bend safely to hang vertically and clear of lower equipment panels that are fastened to the rack.

3. A cable management assembly according to claim 2, including latches associated with the door for operatively engaging the trough, to retain the door at said first position.

4. A cable management assembly according to claim 2, wherein the door has a height greater than the height of the back wall of the trough, so that the door extends vertically to protect cables connected on a number of equipment panels fastened to the rack above said back wall when each of said panels has a height substantially equal to the height of the back wall.

5. A cable management assembly according to claim 2, wherein said door is formed of a substantially transparent or translucent material.

6. A cable management assembly according to claim 1, including a number of cable retainers fixed on the bottom wall of the trough for restraining cables that are dressed along the trough.

7. A cable management assembly for an equipment rack wherein equipment panels are fastened along vertical mounting rails of the rack, the assembly comprising:

an elongated trough having a bottom wall and a front wall, and flange parts extending rearward from opposite end portions of the bottom wall in the long direction of the bottom wall;

wherein said flange parts are constructed and arranged to be mounted to a given equipment panel that is fastened to the mounting rails of the equipment rack; and the bottom wall of the trough extends forward a sufficient distance from the flange parts so that the trough can accommodate a number of cables when connected on the given panel, and the cables can be dressed along the length of the bottom wall of the trough.

8. A cable management assembly according to claim 7, wherein opposite end portions of the bottom wall are constructed and arranged to define a minimum bend radius so that cables dressed along the bottom wall bend safely to hang vertically and clear of lower equipment panels that are fastened to the rack.

9. A cable management assembly according to claim 7, wherein said front wall is in the form of a door, and including lugs extending upward from the bottom wall of the trough for supporting the door.

10. A cable management assembly according to claim 9, wherein said door is formed of a substantially transparent or translucent material.

11. A cable management assembly according to claim 7, including at least one cable retainer fixed on the bottom wall of the trough for restraining cables that are dressed along the bottom wall.

12. A cable management assembly according to claim 7, including a pull member projecting from the trough so that the given panel and its associated equipment can be withdrawn from the rack when the flange parts of the trough are mounted on the panel.

13. A cable management assembly for an equipment rack wherein equipment panels are fastened along vertical mounting rails of the rack, the assembly comprising:

an elongated trough having a front wall, a bottom wall and a back wall;

wherein opposite end portions of the back wall in the long direction of the back wall are arranged to be mounted to a given equipment panel that is fastened to rails of an equipment rack; and the bottom wall of the trough extends forward a sufficient distance from the back wall so that the trough can accommodate a number of cables when terminated at one or more equipment panels including said given panel, and the cables can be dressed along the length of the bottom wall.

14. A cable management assembly according to claim 13, wherein opposite end portions of the bottom wall are constructed and arranged to define a minimum bend radius so that cables dressed along the bottom wall bend safely to hang vertically and clear of lower equipment panels that are fastened to the rack.

15. A cable management assembly according to claim 13, including a generally rectangular door, and hinge parts associated with the front wall of the trough for engaging the door near a bottom edge to permit swinging movement of the door with respect to the trough between a first position whereat the door extends vertically to protect cables terminated at one or more equipment panels including said given panel, and a second position whereat the door is swung downward to permit access to the cables.

16. A cable management assembly according to claim 15, including latches associated with the door for operatively engaging the trough, to retain the door at said first position.

17. A cable management assembly according to claim 15, wherein the door has a height sufficient to protect cables terminated at one or more equipment panels that are fastened to the rack above said given panel, when the door is at said first position.

18. A cable management assembly according to claim 15, wherein said door is formed of a substantially transparent or translucent material.

19. A cable management assembly according to claim 13, including a number of cable retainers fixed on the bottom wall of the trough for restraining cables that are dressed along the trough.

* * * * *